US006947077B1

(12) United States Patent
Krymski

(10) Patent No.: US 6,947,077 B1
(45) Date of Patent: Sep. 20, 2005

(54) FAST AND ACCURATE ADJUSTMENT OF GAIN AND EXPOSURE TIME FOR IMAGE SENSORS

(75) Inventor: Alexander I. Krymski, Montrose, CA (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 09/281,765

(22) Filed: Mar. 30, 1999

Related U.S. Application Data

(60) Provisional application No. 60/079,924, filed on Mar. 30, 1998.

(51) Int. Cl.⁷ .................. H04N 5/235; H04N 5/228; G03B 7/00; G06M 3/00; H03K 21/38
(52) U.S. Cl. .................. 348/222.1; 348/221.1; 348/229.1; 348/362; 377/53; 377/107
(58) Field of Search .................. 348/221.1, 222.1, 348/294–298, 221, 222, 229, 362–367; 377/16, 377/20, 33, 49, 53, 107, 108, 45, 116

(56) References Cited

U.S. PATENT DOCUMENTS

| | | | | |
|---|---|---|---|---|
| 3,704,361 A | * | 11/1972 | Patterson | 377/107 |
| 3,924,614 A | * | 12/1975 | Segal | 377/27 |
| 4,037,254 A | * | 7/1977 | Monahan | 348/221.1 |
| 4,365,272 A | * | 12/1982 | Nagai | 348/229.1 |
| 4,484,223 A | * | 11/1984 | Tsunekawa | 348/297 |
| 4,635,126 A | * | 1/1987 | Kinoshita | 348/297 |
| 4,706,266 A | * | 11/1987 | Qayyum | 377/33 |
| 4,759,043 A | * | 7/1988 | Lewis | 377/116 |
| 4,815,114 A | * | 3/1989 | Pham | 377/116 |
| 5,023,893 A | * | 6/1991 | Leung et al. | 377/49 |
| 5,060,243 A | * | 10/1991 | Eckert | 377/111 |
| 5,185,769 A | * | 2/1993 | Wang | 377/29 |
| 5,233,428 A | * | 8/1993 | Alford et al. | 348/230.1 |
| 5,432,830 A | * | 7/1995 | Bonnot | 377/107 |
| 5,600,695 A | * | 2/1997 | Negi | 377/51 |
| 5,790,625 A | * | 8/1998 | Arimilli | 377/16 |
| 5,943,386 A | * | 8/1999 | Chinn et al. | 377/116 |
| 5,960,052 A | * | 9/1999 | Bombal et al. | 377/116 |
| 5,986,705 A | * | 11/1999 | Shibuya et al. | 348/211.9 |
| 5,995,546 A | * | 11/1999 | Richardson | 375/237 |
| 6,195,028 B1 | * | 2/2001 | Fredrickson et al. | 341/132 |
| 6,469,739 B1 | * | 10/2002 | Bechtel et al. | 348/302 |

* cited by examiner

*Primary Examiner*—James J. Groody
*Assistant Examiner*—Nhan Tran
(74) *Attorney, Agent, or Firm*—Dickstein Shapiro Morin & Oshinsky LLP

(57) ABSTRACT

A proportional counting circuit generates count values for use in variably adjusting gain and exposure time of an image sensor array. The count values are adjusted in proportion to the current count value. This technique allows for fast and accurate adjustment of gain and exposure time without sacrificing the visual performance defined by the contrast difference. At least one break-in signal disables counting in some lower bits when a particular higher bit is asserted and allows the count values to be adjusted by a different increment when the count value reaches a predetermined value by asserting the particular higher bit. Break-out signals are used in less significant bits to disable counting in all lower bits than the bit being disabled by the break-in signal from the more significant bit.

26 Claims, 6 Drawing Sheets

| | | | | | Bit No. | | | | | | | | | |
|---|---|---|---|---|---|---|---|---|---|---|---|---|---|---|
| 11 | 10 | 9 | 8 | 7 | 6 | 5 | 4 | 3 | 2 | 1 | 0 | | Value | Increment |
| 0 | 0 | 0 | 0 | 0 | 0 | 0 | 0 | 0 | 0 | 0 | 0 | = | 0 | |
| 0 | 0 | 0 | 0 | 0 | 0 | 0 | 0 | 0 | 0 | 0 | 1 | = | 1 | 1 |
| | | | | | ... | | | | | | | | | 1 |
| 0 | 0 | 0 | 0 | 0 | 0 | 1 | 1 | 1 | 1 | 1 | 1 | = | 63 | 1 |
| 0 | 0 | 0 | 0 | 0 | 1 | 0 | 0 | 0 | 0 | 0 | 0 | = | 64 | 1 |
| 0 | 0 | 0 | 0 | 0 | 1 | 0 | 0 | 0 | 0 | 1 | 0 | = | 66 | 2 ← 502 |
| | | | | | ... | | | | | | | | | 2 |
| 0 | 0 | 0 | 0 | 0 | 1 | 1 | 1 | 1 | 1 | 1 | 0 | = | 126 | 2 |
| 0 | 0 | 0 | 0 | 1 | 0 | 0 | 0 | 0 | 0 | 0 | 0 | = | 128 | 2 ← 504 |
| 0 | 0 | 0 | 0 | 1 | 0 | 0 | 0 | 0 | 1 | 0 | 0 | = | 132 | 4 |
| | | | | | ... | | | | | | | | | 4 |
| 0 | 0 | 0 | 0 | 1 | 1 | 1 | 1 | 1 | 1 | 0 | 0 | = | 252 | 4 |
| 0 | 0 | 0 | 1 | 0 | 0 | 0 | 0 | 0 | 0 | 0 | 0 | = | 256 | 4 |
| 0 | 0 | 0 | 1 | 0 | 0 | 0 | 0 | 1 | 0 | 0 | 0 | = | 264 | 8 |
| | | | | | ... | | | | | | | | | 8 |
| 0 | 0 | 0 | 1 | 1 | 1 | 1 | 1 | 0 | 0 | 0 | 0 | = | 504 | 8 |
| 0 | 0 | 1 | 0 | 0 | 0 | 0 | 0 | 0 | 0 | 0 | 0 | = | 512 | 8 |
| 0 | 0 | 1 | 0 | 0 | 0 | 0 | 1 | 0 | 0 | 0 | 0 | = | 528 | 16 |
| | | | | | ... | | | | | | | | | 16 |
| 0 | 0 | 1 | 1 | 1 | 1 | 1 | 1 | 0 | 0 | 0 | 0 | = | 1008 | 16 |
| 0 | 1 | 0 | 0 | 0 | 0 | 0 | 0 | 0 | 0 | 0 | 0 | = | 1024 | 16 |
| 0 | 1 | 0 | 0 | 0 | 0 | 1 | 0 | 0 | 0 | 0 | 0 | = | 1056 | 32 |
| | | | | | ... | | | | | | | | | 32 |
| 0 | 1 | 1 | 1 | 1 | 1 | 1 | 0 | 0 | 0 | 0 | 0 | = | 2016 | 32 ← 506 |
| 1 | 0 | 0 | 0 | 0 | 0 | 0 | 0 | 0 | 0 | 0 | 0 | = | 2048 | 32 ← 508 |
| 1 | 0 | 0 | 0 | 0 | 1 | 0 | 0 | 0 | 0 | 0 | 0 | = | 2112 | 64 ← 510 |
| | | | | | ... | | | | | | | | | 64 |
| 1 | 1 | 1 | 1 | 1 | 1 | 0 | 0 | 0 | 0 | 0 | 0 | = | 4032 | 64 |

FIG. 5

FAST AND ACCURATE ADJUSTMENT OF GAIN AND EXPOSURE TIME FOR IMAGE SENSORS

CROSS-REFERENCE TO RELATED APPLICATION

This application claims benefit of the priority of U.S. Provisional Application Ser. No. 60/079,924, filed Mar. 30, 1998 and entitled "Method and Circuit for Fast and Accurate Adjustments of Integration time for CMOS APS Cameras".

BACKGROUND

This specification generally relates to image sensors. More specifically, the present specification provides variable adjustment of gain and exposure time for an image sensor array.

Complementary metal-oxide semiconductor (CMOS) active pixel sensor (APS) technology is an integrated circuit technology for electronically capturing images, therefore forming an "electronic film." Unlike charge-coupled device (CCD) image sensors that have been used in the past to capture electronic images, the CMOS APSs use mainstream microelectronic fabrication processes to produce the sensor chips. The advantages of the CMOS APS technology are low cost, small size, and an ability to integrate a significant amount of very-large-scale-integrated (VLSI) electronics on-chip.

In the CMOS APS device, each pixel of an image sensor array has both a photodetector and also active transistor circuitry for readout of the pixel signal. The photodetector for each pixel in the image sensor array converts photons impinging on it to an electric charge via the photoelectric effect. The charge is integrated over a period of time long enough to collect a detectable amount of charge but short enough to avoid saturating storage elements. This period is analogous to a film exposure time (i.e. the shutter speed) and is called an integration time.

In general, photodetectors are more sensitive to light than film, which allows APS cameras to have the short integration times ranging from $1/30$ to $1/20000$ of a second. N In the image sensor array of the CMOS APS device, the integration time is the time between a reset of a given row and a subsequent read of the row. Since only one row can be selected at a time, the reset/read routine is sequential (i.e. row by row). This routine is referred to as a "rolling electronic shutter." The integration time is adjusted by a fixed amount as a result of an image exposure analysis using an average intensity scheme or image histogram measurements.

The shutter width is the time between integration enable and readout. This can be of any size depending on the number of adjacent pixels that will have the same integration time. The shutter width can be shorter or longer than one row. The shutter width can also be adjusted by a fixed value to control the gain of an exposed area of a sensor array.

Some of the disadvantages of using constant adjustment values for the shutter width and the integration time include a slow adaptation time and a high quantization noise. The adaptation time is the amount of time it takes to adjust the integration times for the entire image sensor array. The adaptation time can be very long for a large sensor array with a large number of rows for a system with a fixed shutter width. For example, the adaptation time is more than one minute for a shutter width of one-half of a row and an integration time of $1/30$ second for a 1000-by-1000 sensor array.

The quantization noise relates to an increment of the shutter width and the accuracy of the integration time. Both affect the visibility of an image contrast difference. The image contrast difference is a percentage change in the integration time and can be expressed as a ratio of the change in integration time over the integration time. The human eye can resolve the contrast difference on the order of about 2%. Thus, for example, change in shutter width from 10 rows to 11 rows will be visible since this is equivalent to a 10% contrast difference. However, the decrease in the shutter width to shorter than one row size to allow small contrast difference causes significant increase in the adaptation time.

SUMMARY

The inventor noticed that by using a proportional up-down counter with a variable increment that is proportional to the current count value, the shutter width and the integration time can be variably adjusted for a fast adaptation time and a highly accurate adjustment size. The accuracy in adjustment leads to low contrast difference. The output of the proportional up-down counter is used to adjust the shutter width and the integration time.

In one aspect, the present disclosure involves the generation of count values for use in variably adjusting gain and exposure time of an image sensor array. The count values are incremented or decremented in proportion to the current count value. This technique allows for fast and accurate adjustment of gain and exposure time without sacrificing the visual performance defined by the contrast difference.

In some embodiments, an input disabling signal, called a break-in signal, disables counting in some lower bits when a particular higher bit is asserted. Therefore, the break-in signal allows the count values to be adjusted by a larger or smaller increment when the count value reaches a predetermined value by asserting the particular higher bit.

In other embodiments, there are at least one break-in signal. The break-in signal comes in from a more significant bit and another from one higher bit. In further embodiments, break-out signals are used in less significant bits to disable counting in all bits lower than the bit being disabled by the break-in signal from the more significant bit.

In another aspect, an image sensor system, such as an APS camera, for use in converting an optical image to a digital image is featured. The system includes an image sensor array, a timing and control circuitry including a proportional counting circuit, and an analog-to-digital converter. In some embodiments, the system also includes a display device to display the digital image.

Among the advantages of the present disclosure is the flexibility of the gain and exposure time adjustment process to allow low image contrast difference without sacrificing on the adaptation time. This advantageous feature is accomplished by variably adjusting the shutter widths and integration times and leads to fast and accurate control of those parameters. The details of one or more embodiments of the invention are set forth in the accompanying drawings and the description below. Other features, objects, and advantages of the invention will be apparent from the description and drawings, and from the claims.

BRIEF DESCRIPTION OF THE DRAWINGS

FIG. 5 is an example of an output of a 12-bit proportional up-down counter with six break-in signals.

Like reference numbers and designations in the various drawings indicate like elements.

DETAILED DESCRIPTION

The present disclosure describes adjustment of the shutter widths and integration times for an image sensor array. The shutter widths and integration times are controlled by a proportional up-down counter whose variable increment is proportional to the current count value.

Figure 1:
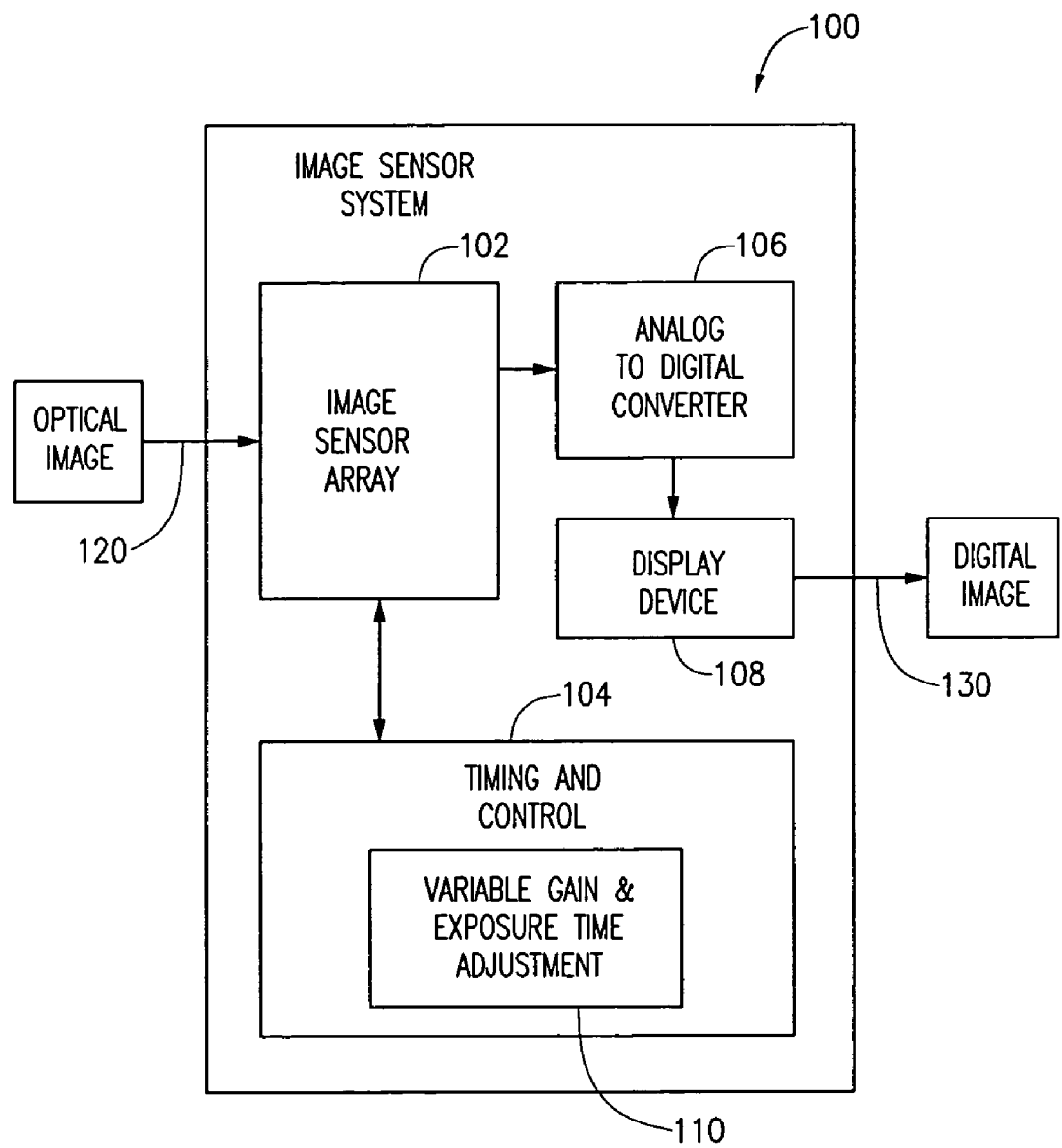
FIG. 1 is a block diagram of an image sensor system.

FIG. 1 shows a block diagram of an image sensor system 100, such as a CMOS APS camera, that converts an optical image 120 into a digital image 130. The image sensor system 100 receives photons from an optical image 120 onto photodetectors in an image sensor array 102. The photodetectors convert photons impinging on it to an electric signal indicative thereof.

A variable gain and exposure time adjustment system 110 in a timing and control circuit 104 sets an integration time period sufficient to collect a detectable amount of charge without saturating the storage elements in the photodetectors. The variable gain and exposure time adjustment system 110 sets gain values according to the proportional up-down counter output.

The electric charge integrated by an electronic circuitry in the image sensor array 102 is sent to an analog-to-digital converter (ADC) 106 to convert the analog voltage into a digital data. Finally, the digital data is displayed on a display device 108 or is sent through a bus 130 to be displayed on an external display device.

Figure 2:
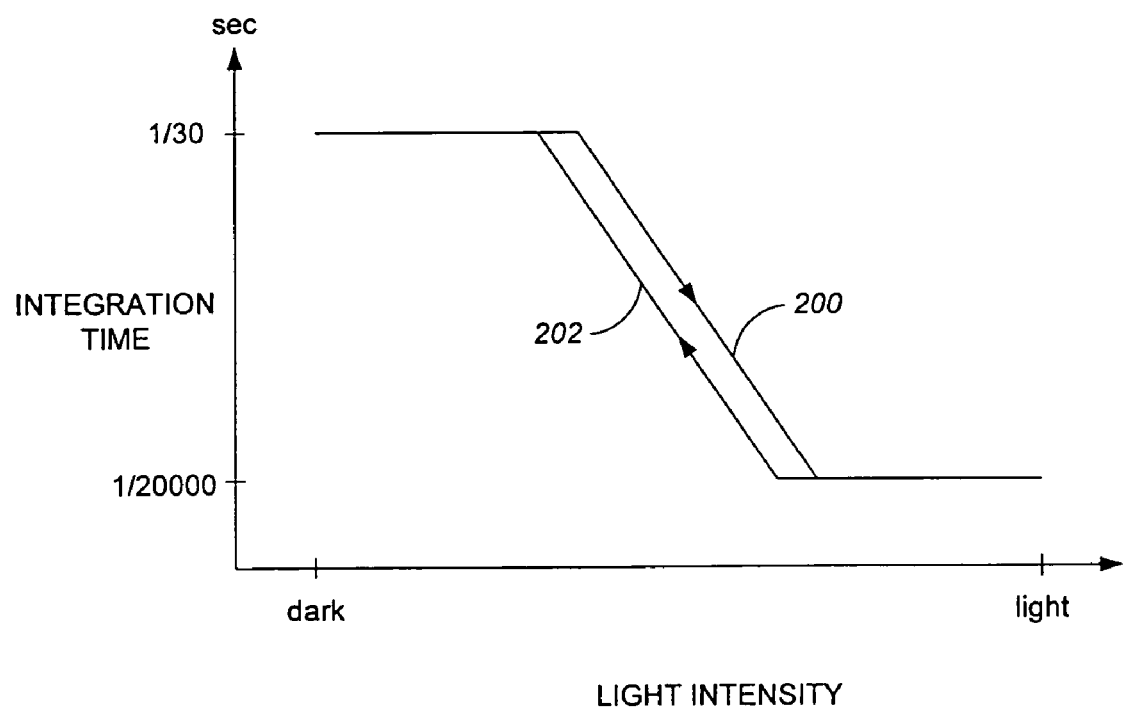
FIG. 2 is a plot of the integration time adjustment process.

FIG. 2 shows a plot of the integration time adjustment between exposure time values of 1/30 and 1/20000 of a second.

The plot shows the process of decreasing the integration time as the light intensity increases and increasing the integration time as the light intensity decreases.

Figure 3A:
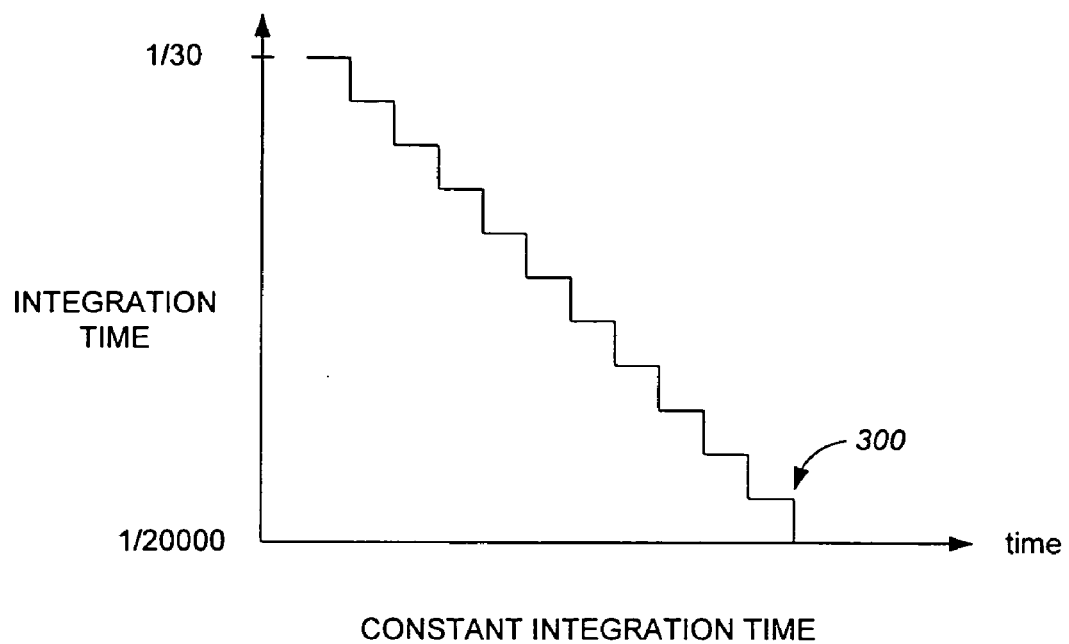
FIGS. 3A and 3B show one example of the difference between a constant integration time process and a variable integration time process.
Figure 3B:
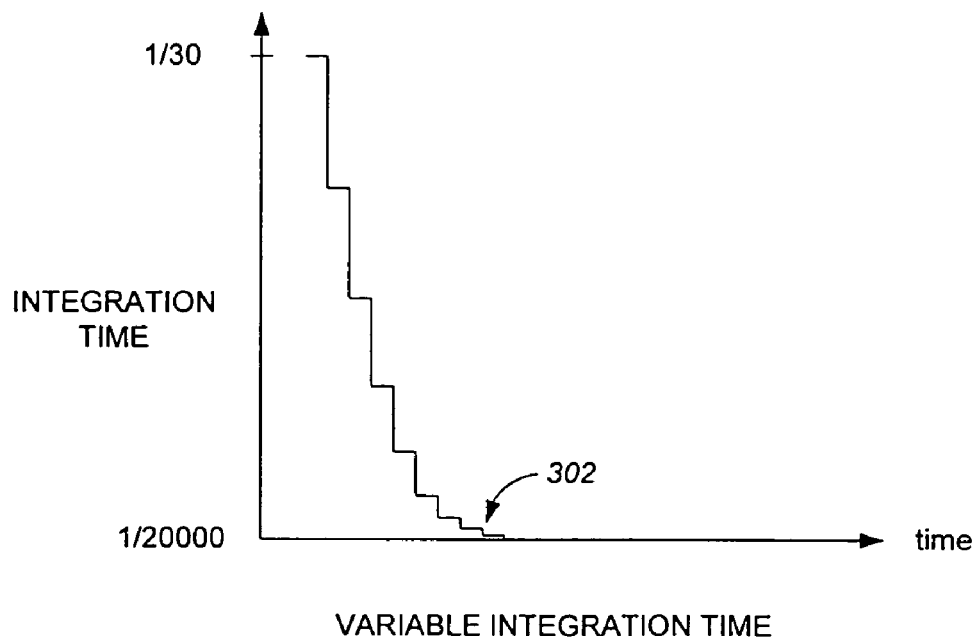

FIGS. 3A and 3B show one example of the difference between a constant integration time process and a variable integration time process. The constant integration time process shown in FIG. 3A takes longer time and produces relatively high quantization noise 300 near the low limit of the integration time. The variable integration time process shown in FIG. 3B, on the other hand, achieves a faster adaptation time with less quantization noise 302 near the low limit of the integration time. The less quantization noise 302 also promotes small contrast difference and makes the change in integration time much less visible.

Figure 4A:
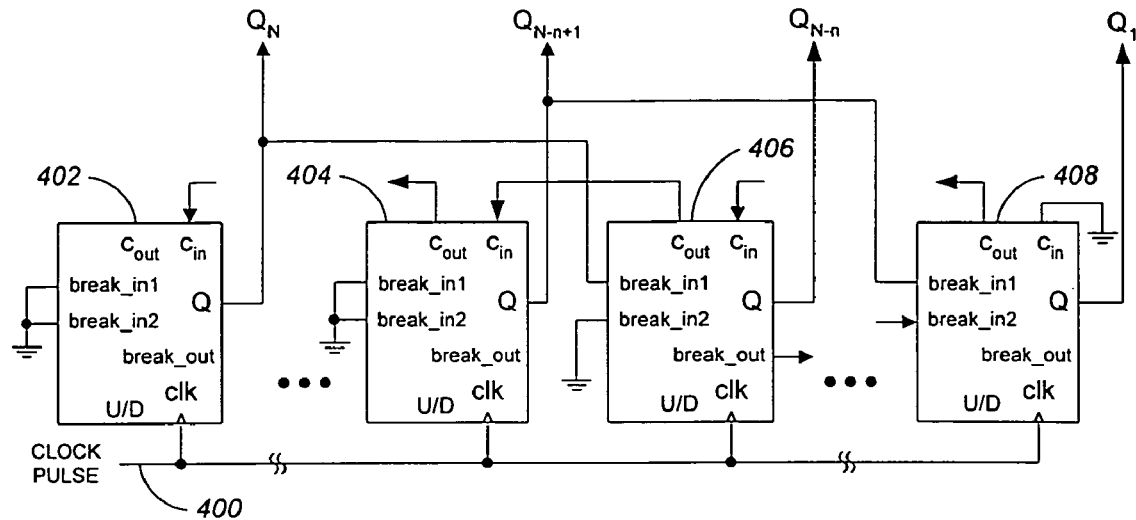
FIG. 4A is one embodiment of the proportional up-down counter.
Figure 4B:
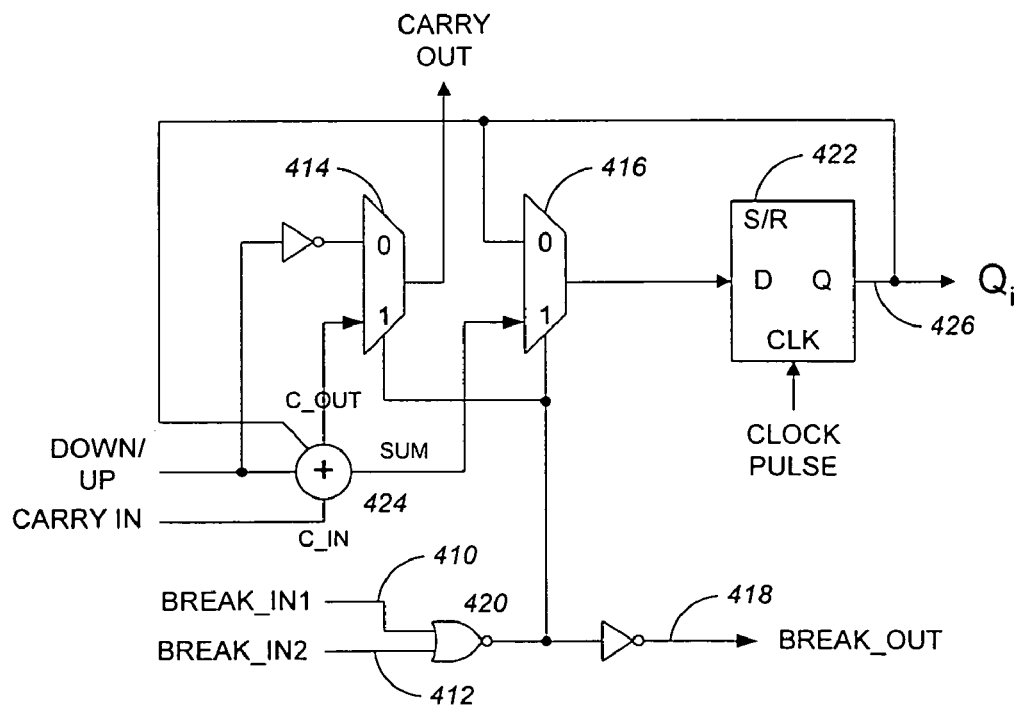
FIG. 4B is a detailed block diagram of one of the bit counters of the proportional up-down counter.

FIGS. 4A and 4B show one embodiment of the proportional up-down counter. FIG. 4A shows four bits of an N bit proportional up-down counter: one most-significant bit (MSB) counter 402, one least-significant bit (LSB) counter 408, and the two bit counters in the middle 404, 406. Each bit is synchronized and triggered by a clock pulse 400. The proportional up-down counter has many of the same signals and blocks as a conventional up-down counter, such as carry-in/carry-out signals, down/up signal, an adder, and a D-type flip-flop. However, the proportional counter has a few additional signals and blocks, such as "break-in" and "break-out" signals and two multiplexers. The break-in and break-out signals are signals used to allow variable adjustment of a count increment as a count value increases or decreases. The count increment is proportionally adjusted by the up-down counter by using the break-in and break-out signals.

The break-in signals are used to disable counting in the lower bits as the count value increases. This allows the counter to increment the count value by a larger number as the count value increases or by a smaller number as the count value decreases.

There are n number of break-in signals used to disable bit counters. In one embodiment, n is equal to N/2. For example, in a 12-bit proportional up-down counter, there are six break-in signals used to increment the counter proportionally. The output of the $12^{th}$ bit counter 402 is used to disable the $6^{th}$ bit counter 406 and all the lower bit counters. This allows the up-down counter to count by 64. The $11^{th}$ bit counter output disables the $5^{th}$ bit counter and all the lower bit counters, and so on. The first bit or the LSB counter 408 is disabled by the $7^{th}$ bit counter 404, thus allowing the up/down counter to count by two.

The break-out signal is used to disable all the lower bit counters.

FIG. 4B shows a detailed block diagram of one of the bit counters of the proportional up-down counter. The break-in signals 410, 412 control the two multiplexers 414, 416. The first break-in signal 410 comes in from a higher significant bit counter and the second break-in signal 412 comes in from the break-out signal of the one higher bit counter. Thus, for example, if the diagram shown in FIG. 4B is a $5^{th}$ bit counter, the first break-in signal comes in from the $11^{th}$ bit counter and the second break-in counter comes in from the $6^{th}$ bit counter.

When both break-in signals are de-asserted, the output of the NOR gate 420 results in a logic high. This allows the counter to operate like a conventional counter. The multiplexer 414 outputs the carry out bit and the multiplexer 416 outputs the sum of an adder 424.

When either break-in signals is asserted, the output of the NOR gate 420 results in a logic low. This selects zero inputs of the two multiplexers 414, 416. The multiplexer 414 outputs a logic high at the carry-out output if the counter is counting up and outputs a logic low if the counter is counting down. The multiplexer 416 puts the counter in an idle state by feeding the counter output 426 back to the input of the D-type flip-flop 422. The break-out signal 418 is sent to the second break-in signal of the one lower bit counter.

Figure 4C:
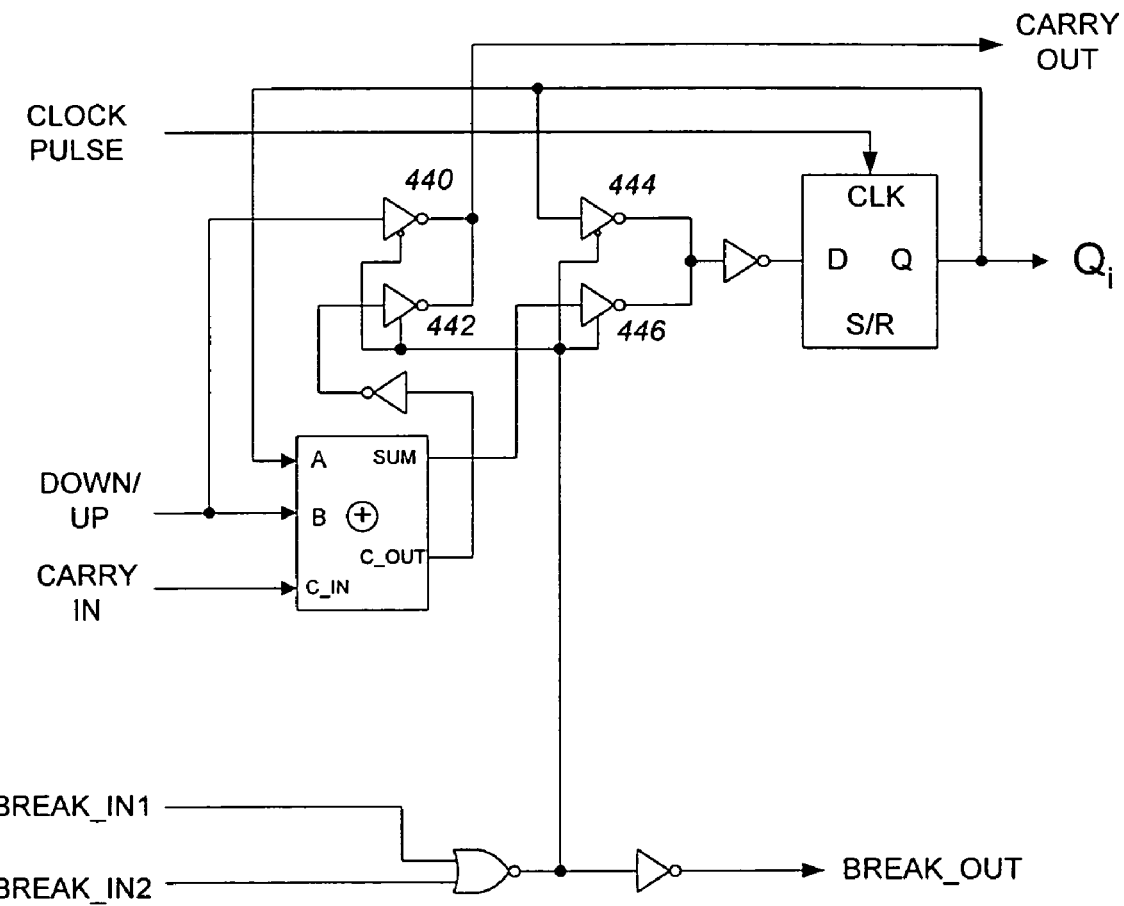
FIG. 4C is a detailed schematic diagram of one of the bit counters of the proportional up-down counter.

FIG. 4C is a detailed schematic diagram of the counter described above for FIG. 4B. Each multiplexers 414 or 416 are implemented with a pair of tri-state inverters 440, 442 or 444, 446.

FIG. 5 is an example of a tabulated output of a 12-bit proportional up-down counter with six break-in signals. The bit patterns show the variable increment changing as more significant bits are asserted. When the more significant bits are asserted, the count value increases and the increment is adjusted accordingly. For example, the count increment is one until the count value reaches 64 at 502 (i.e. when the $7^{th}$ bit is asserted). From that point on, the break-in signal disables counting in the first bit and the count increment is adjusted to two. The count increment is increased to four when the $8^{th}$ bit is asserted at 504, and so on. When the count value reaches 2048 at 508 from 2016 at 506, the $12^{th}$ bit is asserted and the lower six bits are disabled. This adjusts the count increment from 32 to 64. Therefore, the next count value is 2112 at 510.

A number of embodiments of the present invention have been described. Nevertheless, it will be understood that various modifications may be made without departing from the spirit and scope of the invention. For example, some versions of the proportional up-down counter described above are implemented in application specific integrated circuits (ASICs). Alternative embodiments of the proportional up-down counter are carried out in discrete digital components, in computer programs executed by programmable processors, or in some combination of these technologies. Accordingly, other embodiments are within the scope of the following claims.

What is claimed is:

1. A N-bit proportional bit counting circuit comprising:
N counter cells, at least M of said counter cells comprising,
 (a) a first input element that receives a plurality of independent break-in signals to change a counting operation; and
 (b) a bit processing element coupled to the first input element and configured to receive a clock signal and further configured to, on each pulse of said clock signal:
  (1) enable counting if all of the break-in signals are de-asserted; and
  (2) disable counting if at least one of the break-in signals is asserted;
wherein
 N is an integer greater than or equal to 3,
 M is an integer greater than or equal to 2 and less than N,
 said M counter cells form a sequence of adjacent bits of said counter, and
 in each of said M counter cells, said first input element receives a same number of said independent break-in signals.

2. The circuit of claim 1, wherein the bit processing element includes:
 (a) a second input element that receives a carry-in signal;
 (b) a counting element having an input and an output, where the counting element is coupled to the second input element and configured to sum the carry-in signal and the output of the counting element; and
 (c) a selection element coupled to the first input element to receive the at least one break-in signal, the selection element also coupled to the counting element and configured to:
  (1) hold the counting element in an idle state if the at least one break-in signal is asserted; and
  (2) command the counting element to latch the computed sum if each of break-in signals is de-asserted.

3. The circuit of claim 2, wherein the bit processing element also includes a second selection element coupled to the first input element and the counting element, the second selection element configured to generate a carry-out signal, where the carry-out signal is a carry out from the sum computed in the counting element.

4. The circuit of claim 2, wherein the bit processing element further includes an output element that generates a break-out signal, where the break-out signal is asserted if at least one of the at least one break-in signal is asserted and the break-out signal is de-asserted if all of the at least one break-in signal are de-asserted.

5. A proportional bit counting circuit comprising:
a plurality of counter cells, at least one of said counter cells comprising,
 (a) a first input element that receives a plurality of independent break-in signals to change a counting operation;
 (b) a second input element that receives a carry-in signal;
 (c) a counting element having a clock input, a signal input, and an output, where the counting element is coupled to the first and second input elements and configured to:
  receive a clock signal on said clock input, and,
  on each pulse of said clock signal,
   enable counting if all of the break-in signals are de-asserted:
   disable counting if at least one of the break-in signals is asserted; and
   sum the carry-in signal and the output of the counting element.

6. The circuit of claim 5, further comprising a second selection element coupled to the first input element and the counting element, the second selection element configured to generate a carry-out signal, where the carry-out signal is a carry out from the sum computed in the counting element.

7. The circuit of claim 5, further comprising a third input element that receives a down-up signal indicating whether to count down or count up and coupled to the counting element, the counting element configured to sum the down-up signal with the carry-in signal and the output of the counting element.

8. The circuit of claim 7, further comprising a second selection element coupled to the input elements and the counting element, the second selection element configured to generate a carry-out signal, where the carry-out signal is:
 (a) an inverted down-up signal if the break-in signal is asserted; and
 (b) a carry out from the sum computed in the counting element if the break-in signal is de-asserted.

9. The circuit of claim 5, wherein the counting element includes:
 (a) a latch circuit that changes the output according to the input, the latch circuit capable of being configured into an idle state when the output is fed directly back into the input; and
 (b) an adding circuit that computes a binary sum of the input.

10. A proportional bit counting circuit comprising:
a plurality of counter cells, at least one of said counter cells comprising,
 (a) a first input element that receives a plurality of independent break-in signals;
 (b) a second input element that receives a carry-in signal;
 (c) a latching element having a clock input, a signal input, and an output;
 (d) a summing element coupled to the second input element and configured to sum the carry-in signal and the output of the latching element; and
 (e) a selection element coupled to the first input element to receive the break-in signals, the selection element also coupled to the summing element and the latching element to, on each pulse of a clock signal received on said clock input,
  (1) hold a counting element in an idle state if at least one of the plurality of break-in signals is asserted; and
  (2) command the counting element to latch the computed sum if each of the the plurality of break-in signals is de-asserted.

11. The circuit of claim 10, further comprising an output element that generates a break-out signal, where the break-out signal is asserted if at least one of the at least one break-in signal is asserted and the break-out signal is de-asserted if all of the at least one break-in signal are de-asserted.

12. The circuit of claim 10, further comprising a second selection element coupled to the first input element and the counting element, the second selection element configured to generate a carry-out signal, where the carry-out signal is a carry out from the sum computed in the counting element.

13. A proportional counting circuit having a count value and for use in adjusting gains and integration times of an image sensor array, the circuit comprising:
    (a) an input clock element that receives a clock signal;
    (b) a plurality, N, of bit counting circuits coupled to the input clock element and configured to count by an increment proportional to the count value and triggered by the clock signal, at least M of the circuits comprising:
        (1) an input element that receives carry-in signals and a plurality of independent break-in signals;
        (2) a plurality of bit processing elements coupled to the input element and configured to, on each pulse of the clock signal,
            (a) enable bit counting and output a bit count if all of the plurality of break-in signals are de-asserted; and
            (b) disable bit counting if at least one of the break-in signals is asserted;
        (3) an output element that generates the count value by collecting bit counts and carry-out signals from the plurality of bit counting circuits;
    wherein
        N is an integer greater than or equal to 3,
        M is an integer greater than or equal to 2 and less than N,
        said M counter cells form a sequence of adjacent bits, and
        in each of said M counter cells, said input element receives a same number of said independent break-in signals.

14. The circuit of claim 13, wherein the bit counting is enabled in the plurality of bit processing elements by adding the carry-in signal with a previous bit count value.

15. The circuit of claim 13, wherein the bit counting is disabled in the plurality of bit processing elements by feeding a previous bit count value back to an input of the bit processing element, where the bit processing element is placed in an idle state, and the bit processing element generating carry-out signal.

16. A method for counting, where a count increment is varied proportional to the count value, for use in adjusting gains and integration times of an image sensor array, the method comprising:
    (a) receiving a clock signal;
    (b) on each pulse of said clock signal:
        (1) sending a same plurality of independent break-in signals to a lower bit counter when a higher bit counter is asserted, such that the lower bit counter is disabled from counting, and the count increment and the count value are proportionally adjusted; and
        (2) outputting the adjusted count value.

17. The method of claim 16, wherein the lower bit counter is disabled by feeding a previous bit count value back to an input of the lower bit counter, where the lower bit counter is placed in an idle state.

18. The method of claim 16, further comprising generating carry-out signal when the lower bit counter is disabled from counting.

19. An image sensor system that converts an optical image into a digital image, the system comprising:
    (a) an image sensor array including:
        (1) a plurality of photodetectors to convert photos impinging on the photodetectors to electric charges; and
        (2) an electronic circuitry to integrate the electric charges to analog voltages;
    (b) a timing and control circuitry coupled to the image sensor array and configured to variably adjust the integration time of the electric charge to analog voltages;
    (c) an analog-to-digital converter coupled to the image sensor array to convert the analog voltages to digital voltages representing a digital image;
    wherein said timing and control circuitry includes a N-bit proportional counter, said counter comprising N cells, at least M of said cells receiving a clock signal and a plurality of independent break-in signals and including control circuitry configured to, on each pulse of the clock signal, disable counting if at least one break-in signal is asserted, and
    wherein
        N is an integer greater than or equal to 3,
        M is an integer greater than or equal to 2 and less than N,
        said M counter cells form a sequence of adjacent bits of said counter, and
        in each of said M counter cells, said first input element receives a same number of said independent break-in signals.

20. The system of claim 19, further comprising a display device to display the digital image outputted by the analog-to-digital converter.

21. A N-bit proportional bit counting circuit comprising:
    N counter cells, at least M one of said counter cells comprising,
        a first input element that receives a plurality of non-complementary break-in signals to change a counting operation; and
        a bit processing element coupled to the first input element and configured to receive a clock signal and further configured to, on each pulse of said clock signal:
            enable counting if all of the break-in signals are de-asserted; and
            disable counting if at least one of the break-in signals is asserted;
    wherein
        N is greater than two
        M is greater than or equal to 2 and less than N,
        said M counter cells form a sequence of adjacent bits of said counter, and
        in each of said M counter cells, said first input element receives a same number of said non-complimentary break-in signals.

22. A proportional bit counting circuit comprising:
    a plurality of counter cells, at least one of said counter cells comprising,
        a first input element that receives a plurality of non-complementary break-in signals to change a counting operation;
        a second input element that receives a carry-in signal;

a counting element having a clock input, a signal input, and an output, where the counting element is coupled to the first and second input elements and configured to:
receive a clock signal on said clock input, and further configured to,
on each pulse of said clock signal,
enable counting if all of the break-in signals are de-asserted;
disable counting if at least one of the break-in signals is asserted; and
sum the carry-in signal and the output of the counting elements.

23. A proportional bit counting circuit comprising:
a plurality of counter cells, at least one of said counter cells comprising,
a first input element that receives a plurality of non-complementary break-in signals;
a second input element that receives a carry-in signal;
a latching element having a clock input, a signal input, and an output;
a summing element coupled to the second input element and configured to sum the carry-in signal and the output of the latching element; and
a selection element coupled to the first input element to receive the break-in signals, the selection element also coupled to the summing element and the latching element to, on each pulse of a clock signal received on said clock input,
hold a counting element in an idle state if at least one of the plurality of break-in signals is asserted; and
command the counting element to latch the computed sum if each at least of the plurality of break-in signals is de-asserted.

24. A proportional counting circuit having a count value and for use in adjusting gains and integration times of an image sensor array, the circuit comprising:
an input clock element that receives a clock signal;
a plurality, N, of bit counting circuits coupled to the input clock element and configured to count by an increment proportional to the count value and triggered by the clock signal, at least M of the circuits comprising:
an input element that receives carry-in signals and a plurality of non-complementary break-in signals;
a plurality of bit processing elements coupled to the input element and configured to, on each pulse of the clock signal,
enable bit counting and output a bit count if all of the plurality of break-in signals are de-asserted; and
disable bit counting if at least one of the break-in signals is asserted;
an output element that generates the count value by collecting bit counts and carry-out signals from the plurality of bit counting circuits;

wherein
N is an integer greater than or equal to 3,
M is an integer greater than or equal to 2 and less than N,
said M counter cells form a sequence of adjacent bits, and
in each of said M counter cells, said input element receives a same number of said non-complimentary break-in signals.

25. A method for counting, where a count increment is varied proportional to the count value, for use in adjusting gains and integration times of an image sensor array, the method comprising:
receiving a clock signal;
on each pulse of said clock signal:
sending a same plurality of non-complementary break-in signals to a lower bit counter when a higher bit counter is asserted, such that the lower bit counter is disabled from counting, and the count increment and the count value are proportionally adjusted; and
outputting the adjusted count value.

26. An image sensor system that converts an optical image into a digital image, the system comprising:
an image sensor array including:
a plurality of photodetectors to convert photos impinging on the photodetectors to electric charges; and
an electronic circuitry to integrate the electric charges to analog voltages;
a timing and control circuitry coupled to the image sensor array and configured to variably adjust the integration time of the electric charge to analog voltages;
an analog-to-digital converter coupled to the image sensor array to convert the analog voltages to digital voltages representing a digital image;
wherein said timing and control circuitry includes a N-bit proportional counter, said counter comprising N cells, at least M of said cells receiving a clock signal and a plurality of non-complementary break-in signals and including control circuitry configured to, on each pulse of the clock signal, disable counting if at least one break-in signal is asserted, and
wherein
N is greater than three,
M is greater than or equal to 2 and less than N,
said M counter cells form a sequence of adjacent bits of said counter, and
in each of said M counter cells, said first input element receives a same number of said non-complimentary break-in signals.

* * * * *

UNITED STATES PATENT AND TRADEMARK OFFICE
CERTIFICATE OF CORRECTION

PATENT NO. : 6,947,077 B1
APPLICATION NO. : 09/281765
DATED : September 20, 2005
INVENTOR(S) : Alexander Krymski It is certified that error appears in the above-identified patent and that said Letters Patent is hereby corrected as shown below:

In the Specification, the following errors are corrected:

Column 1, lines 39-40,

"is called an integration time.

In general, photodetectors"

should read

--is called an integration time. In general, photodetectors--;

Column 1, line 42,

"times ranging from 1/30 to 1/20000 of a second. N in the image"

should read

--times ranging from 1/30 to 1/20000 of a second.

In the image--;

Column 3, line 44, "(indented) The plot" should read --(not indented) The plot--; and Column 4, lines 36-37, "counter.

When both break-in signals"

should read

--counter. When both break-in signals--.

UNITED STATES PATENT AND TRADEMARK OFFICE
CERTIFICATE OF CORRECTION

PATENT NO.        : 6,947,077 B1
APPLICATION NO. : 09/281765
DATED              : September 20, 2005
INVENTOR(S)       : Alexander Krymski It is certified that error appears in the above-identified patent and that said Letters Patent is hereby corrected as shown below:

In the Claims, the following errors are corrected:

Claim 2, column 5, line 55, "of break-in" should read --of the break-in--;

Claim 4, column 5, line 65, "signal is" should read --signals is--;

Claim 4, column 5, line 67, "signal are" should read --signals are--;

Claim 11, column 7, line 5, "signal are" should read --signals are--;

Claim 15, column 7, lines 50-51, "element generating" should read --element is generating a--;

Claim 21, column 8, line 54, "than two" should read --than 3,--;

Claim 21, column 8, line 59, "non-complimentary" should read --non-comlementary--;

Claim 22, column 9, lines 5-6, "and further configured to," should read --and--;

Claim 23, column 9, line 33, "each at least of" should read --each of--;

Claim 24, column 9, line 36, "count value and for" should read --count value for--;

Claim 24, column 10, line 8, "non-complimentary" should read --non-complementary--; and

UNITED STATES PATENT AND TRADEMARK OFFICE
CERTIFICATE OF CORRECTION

PATENT NO. : 6,947,077 B1
APPLICATION NO. : 09/281765
DATED : September 20, 2005
INVENTOR(S) : Alexander Krymski It is certified that error appears in the above-identified patent and that said Letters Patent is hereby corrected as shown below:

Claim 26, column 10, line 52, "non-complimentary" should read --non-complementary-- .

Signed and Sealed this

Twenty-sixth Day of December, 2006

JON W. DUDAS
*Director of the United States Patent and Trademark Office*